United States Patent
You et al.

(10) Patent No.: US 11,379,084 B2
(45) Date of Patent: Jul. 5, 2022

(54) TOUCH SENSOR AND DISPLAY DEVICE HAVING THE SAME

(71) Applicant: Samsung Display Co., Ltd., Yongin-si (KR)

(72) Inventors: Chun Gi You, Yongin-si (KR); Tae Ik Kim, Yongin-si (KR); Hyun Sik Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/063,559

(22) Filed: Oct. 5, 2020

(65) Prior Publication Data

US 2021/0247872 A1    Aug. 12, 2021

(30) Foreign Application Priority Data

Feb. 7, 2020 (KR) .................. 10-2020-0015152

(51) Int. Cl.
*G06F 3/044* (2006.01)
*H01L 27/12* (2006.01)
*H01L 23/31* (2006.01)
*H01L 23/48* (2006.01)

(52) U.S. Cl.
CPC .......... *G06F 3/0443* (2019.05); *G06F 3/0448* (2019.05); *H01L 23/31* (2013.01); *H01L 23/48* (2013.01); *H01L 27/12* (2013.01)

(58) Field of Classification Search
CPC .... G06F 3/0443; G06F 3/0446; G06F 3/0448; G06F 3/044; G06F 2203/04103; G06F 2203/04111; G06F 2203/04112
See application file for complete search history.

(56) References Cited

U.S. PATENT DOCUMENTS

| | | |
|---|---|---|
| 8,866,756 B2 | 10/2014 | Kwak et al. |
| 9,720,449 B2 | 8/2017 | Ko et al. |
| 9,958,973 B2 | 5/2018 | Han et al. |

(Continued)

FOREIGN PATENT DOCUMENTS

| | | |
|---|---|---|
| KR | 10-1093351 | 12/2011 |
| KR | 10-2017-0139486 | 12/2017 |
| KR | 10-2004820 | 7/2019 |

*Primary Examiner* — Xuemei Zheng

(74) *Attorney, Agent, or Firm* — H.C. Park & Associates, PLC

(57) ABSTRACT

A touch sensor for a display device includes: a base layer; a plurality of first sensing electrodes and a plurality of second sensing electrodes spaced apart from each other on the base layer; a first connector electrically connecting the first sensing electrodes adjacent to each other; a first insulating layer disposed on the first sensing electrodes and the second sensing electrodes; a conductor disposed on the first insulating layer and connected to the second sensing electrodes through the first insulating layer; and a second insulating layer disposed on the first insulating layer to cover the conductor. The first insulating layer includes a first opening exposing at least one of a portion of a first separation area between the first connector and the second sensing electrodes, a portion of the first connector, and a portion of the second sensing electrodes, and the first opening is spaced apart from the conductor.

19 Claims, 12 Drawing Sheets

(56) References Cited

U.S. PATENT DOCUMENTS

| | | | |
|---|---|---|---|
| 2013/0328830 A1* | 12/2013 | Han | G06F 3/0416 |
| | | | 345/174 |
| 2015/0153779 A1 | 6/2015 | Ko et al. | |
| 2016/0306462 A1* | 10/2016 | Park | G06F 3/0443 |
| 2017/0357348 A1* | 12/2017 | Lee | G06F 3/0443 |
| 2018/0040672 A1* | 2/2018 | Park | H01L 27/323 |

* cited by examiner

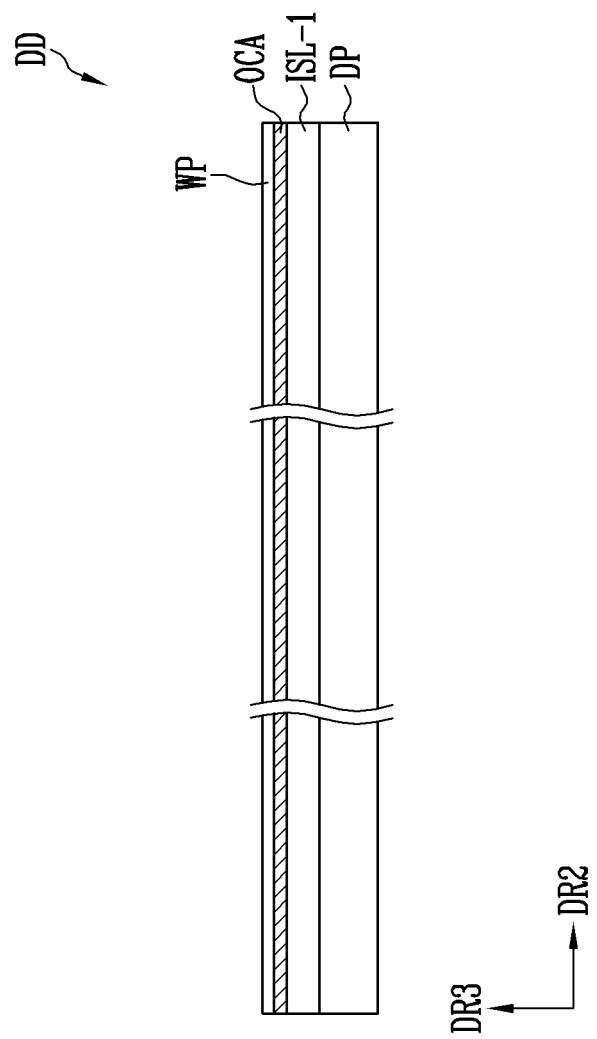

TOUCH SENSOR AND DISPLAY DEVICE HAVING THE SAME

CROSS REFERENCE TO RELATED APPLICATION

This application claims priority from and the benefit of Korean Patent Application No 10-2020-0015152, filed on Feb. 7, 2020, which is hereby incorporated by reference for all purposes as if fully set forth herein.

BACKGROUND

Field

Exemplary implementations of the invention relate generally to a display device and more specifically, to a display device with a touch sensor.

Discussion of the Background

Recent display devices have been developed to perform an information input function in addition to an image display function. In general, the information input function of the display device may be implemented as a touch sensor for receiving a touch of a user or a touch from a predetermined tool.

The touch sensor such as an input sensing unit is attached to one surface of a display panel implementing the image display function or formed integrally with the display panel to be used. The user may input information by pressing or touching the input sensing unit while viewing the image displayed by the display panel.

A defect such as a short circuit or a disconnection of an internal circuit may occur due to static electricity generated during a manufacturing process or a use process of the input sensing unit, and research for preventing the defect due to the static electricity is being conducted.

The above information disclosed in this Background section is only for understanding of the background of the inventive concepts, and, therefore, it may contain information that does not constitute prior art.

SUMMARY

Applicant discovered that a touch sensor of display devices can be damaged by static electricity during the manufacturing process.

Touch sensors and display devices including the same constructed according to the principles and some exemplary implementations of the invention minimize or prevent the touch senor from being damaged by the static electricity. For example, the touch sensor may include an insulating layer with one or more openings exposing sensing electrodes such that static electricity may not accumulate between the sensing electrodes but may be discharged. Thus, defects such as short circuits between the sensing electrodes may be minimized or prevented.

Touch sensors and display devices including the same constructed according to the principles and some exemplary implementations of the invention include a recess, such as a concave portion, in a connector extending between sensing electrodes to minimize the accumulation of static electricity. Thus short circuit defects or the like in the touch sensor due to the inflow of the static electricity may be improved.

Touch sensors and display devices including the same constructed according to the principles and some exemplary implementations of the invention have conductors, such as, conductive patterns for connecting the sensing electrodes to each other that are short in length to reduce the resistance due to the conductive pattern and/or make the conductive pattern difficult to be recognized or observed by the user.

Additional features of the inventive concepts will be set forth in the description which follows, and in part will be apparent from the description, or may be learned by practice of the inventive concepts.

According to one aspect of the invention, a touch sensor for a display device includes: a base layer; a plurality of first sensing electrodes and a plurality of second sensing electrodes spaced apart from each other on the base layer; a first connector electrically connecting the first sensing electrodes adjacent to each other; a first insulating layer disposed on the first sensing electrodes and the second sensing electrodes; a conductor disposed on the first insulating layer and connected to the second sensing electrodes through the first insulating layer; and a second insulating layer disposed on the first insulating layer to cover the conductor, wherein the first insulating layer includes a first opening exposing at least one of a portion of a first separation area between the first connector and the second sensing electrodes, a portion of the first connector, and a portion of the second sensing electrodes, and the first opening is spaced apart from the conductor.

The first sensing electrodes may be arranged along a first direction, the second sensing electrodes are arranged along a second direction intersecting the first direction, and the first sensing electrodes, the second sensing electrodes, and the first connector are disposed on a same layer.

The touch sensor may further include: an electrode electrically connecting the second sensing electrodes adjacent to each other, wherein the electrode may be disposed on the same layer as the first sensing electrodes and surrounded by the first sensing electrodes, and the electrode may be spaced apart from the first sensing electrodes and the second sensing electrodes.

The first insulating layer may further include a second opening overlapping a second separation area between the electrode and the first connector, and the second opening exposes a portion of the electrode and a portion of the first connector.

The first insulating layer may further include a third opening overlapping the second separation area, and the third opening exposes another portion of the electrode and a portion of the first sensing electrodes.

The first connector may include a first connection portion, the conductor may include a conductive pattern, and the electrode may include an electrode pattern, and the conductive pattern is connected to the electrode pattern through a contact hole passing through the first insulating layer, and the conductive pattern and the electrode pattern may constitute a second connection portion electrically connecting the second sensing electrodes adjacent to each other.

The conductive pattern may include: a first bridge electrode connected to one of the second sensing electrodes adjacent to each other and the electrode pattern; and a second bridge electrode connected to another one of the second sensing electrodes adjacent to each other and the electrode pattern.

At least one of the first sensing electrodes, the second sensing electrodes, and the electrode pattern may include a recess extending inwardly from an edge in a plan view, and the recess may overlap one of the first bridge electrode and the second bridge electrode.

The first opening may expose a portion of the base layer in the first separation area, and the second insulating layer may contact the base layer through the first opening.

The second insulating layer may contact the portion of the first connector and the portion of the second sensing electrodes exposed by the first opening.

The first insulating layer may further include a fourth opening exposing the first separation area between the first sensing electrodes and the second sensing electrodes, a portion of the first sensing electrodes, and a portion of the second sensing electrodes.

The conductor may electrically connect the second sensing electrodes adjacent to each other through a contact hole passing through the first insulating layer.

The first sensing electrodes, the second sensing electrodes, and the first connector may include a transparent conductive material.

The conductor may include a conductive pattern having a single layer or multilayer structure including molybdenum (Mo).

According to another aspect of the invention, a touch sensor for a display device includes: a base layer including a sensing area; a sensing electrode layer disposed in the sensing area of the base layer; a first insulating layer disposed on the sensing electrode layer; a conductor disposed on the first insulating layer and connected to a portion of the sensing electrode layer through the first insulating layer; and a second insulating layer disposed on the first insulating layer to cover the conductor, wherein: the sensing electrode layer includes a recess extending inwardly from an edge in a plan view, and the recess overlaps the conductor.

The sensing electrode layer may include: a plurality of first sensing electrodes arranged along a first direction; a plurality of second sensing electrodes arranged along a second direction intersecting the first direction and spaced apart from the first sensing electrodes by a first distance; and a first connector electrically connecting the first sensing electrodes adjacent to each other, and wherein: the recess may include a concave portion disposed adjacent to an edge of the first sensing electrodes and the second sensing electrodes, and the conductor electrically connects the second sensing electrodes adjacent to each other through a contact hole passing through the first insulating layer.

A second distance between the first sensing electrodes and the second sensing electrodes adjacent to each other in an area including the concave portion may be greater than the first distance.

The sensing electrode layer may include a transparent conductive material, and the conductor may include a conductive pattern having a single layer or multilayer structure including molybdenum (Mo).

The recess may have one of a generally polygonal and a semicircular shape in a plan view.

According to another aspect of the invention, a display device includes: a display panel including a light emitting element and an encapsulation layer covering the light emitting element; and a touch sensor disposed on the display panel, wherein the touch sensor includes: a base layer; a plurality of first sensing electrodes and a plurality of second sensing electrodes spaced apart from each other on the base layer; a first connector electrically connecting the first sensing electrodes adjacent to each other; a first insulating layer disposed on the first sensing electrodes and the second sensing electrodes; a conductor disposed on the first insulating layer and connected to the second sensing electrodes through the first insulating layer; and a second insulating layer disposed on the first insulating layer to cover the conductor, wherein: the first insulating layer includes a first opening exposing a first separation area between the first connector and the second sensing electrodes, a portion of the first connector, and a portion of the second sensing electrodes, and the first opening is spaced apart from the conductor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIGS. 2A to 2C are cross-sectional views schematically illustrating the display device of FIG. 1.

DETAILED DESCRIPTION

Figure 1:
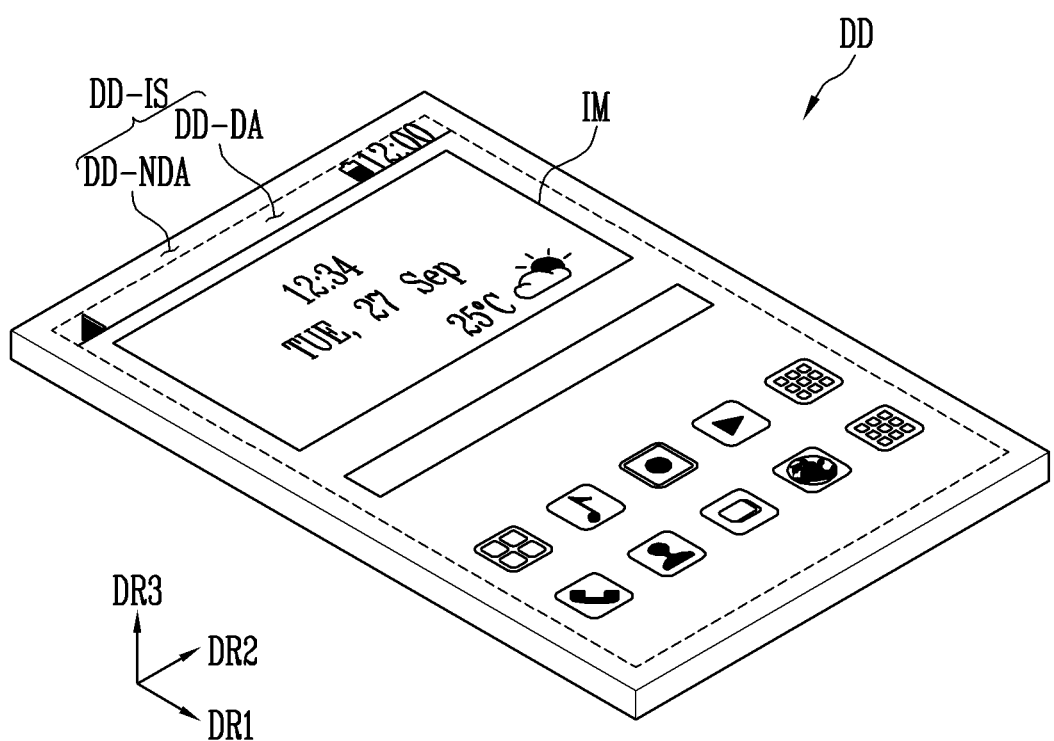
FIG. 1 is a perspective view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view of an exemplary embodiment of a display device constructed according to the principles of the invention.

Referring to FIG. 1, the display device DD may display an image IM through a display surface DD-IS. The display surface DD-IS may be substantially parallel to a surface defined by a first direction DR1 and a second direction DR2. A normal direction of the display surface DD-IS, i.e., a thickness direction of the display device DD, may be indicated by a third direction DR3.

A front surface (or an upper surface) and a back surface (or a lower surface) of each of members, layers, or units described below may be distinguished by the third direction DR3. However, the first to third directions DR1, DR2, and DR3 are merely examples, and the directions indicated by the first to third directions DR1, DR2, and DR3 may be converted into different directions as a relative concept.

The display device DD shown in FIG. 1 may have a substantially planar display surface. However, exemplary embodiments are not limited thereto. For example, the display device DD may have various types of display surfaces capable of displaying an image, such as a curved display surface or a stereoscopic display surface.

The display device DD may be a flexible display device. For example, the display device DD may be applied to a foldable display device, a bendable display device, a rollable display device, and the like. Exemplary embodiments are not limited thereto, and the display device DD may be a rigid display device.

As shown in FIG. 1, the display surface DD-IS of the display device DD may include a display area DD-DA in which the image IM is displayed and a non-display area DD-NDA adjacent to the display area DD-DA. The non-display area DD-NDA may be an area in which the image is not displayed. The non-display area DD-NDA may be disposed outside the display area DD-DA.

Figure 2A:
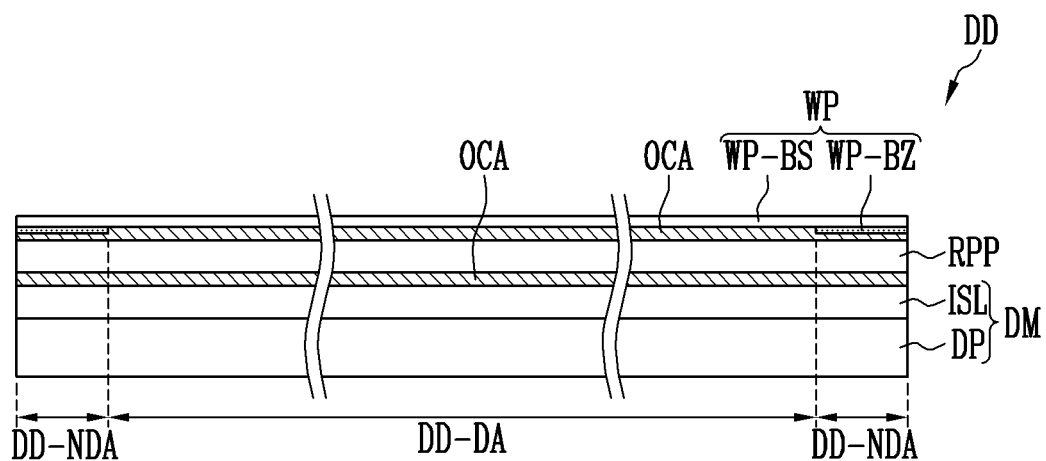
Figure 2B:
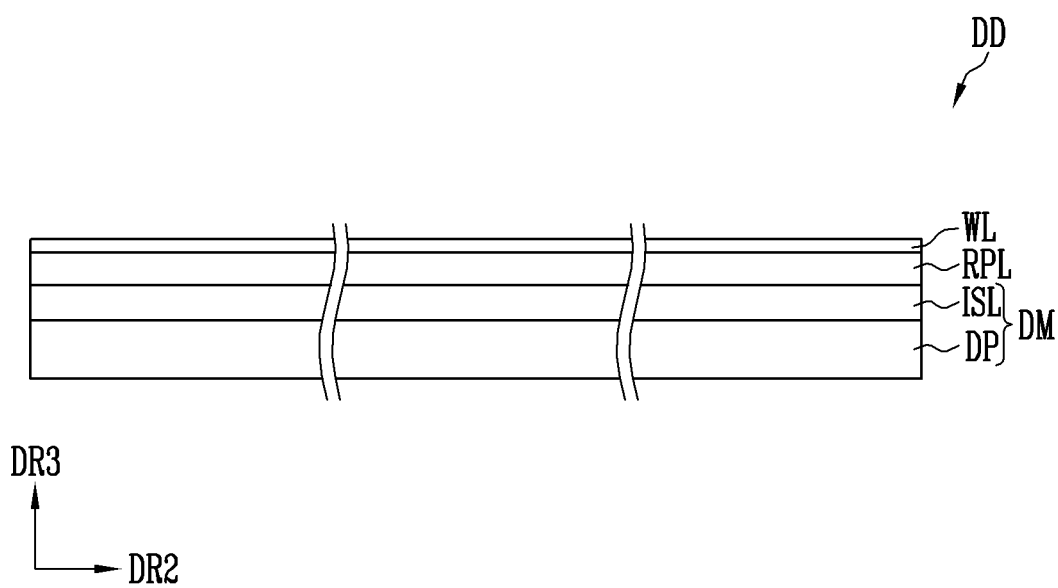

FIGS. 2A to 2C are cross-sectional views schematically illustrating the display device of FIG. 1.

FIGS. 2A to 2C are simply shown for describing the stacked relationship of a functional panel and/or functional units configuring the display device DD.

Referring to FIGS. 2A to 2C, the display device DD may include a display panel DP, a touch sensor such as input sensing units ISL and ISL-1, and window units WL and WP. The display device DD may further include an anti-reflection unit.

In an exemplary embodiment, the input sensing units ISL and ISL-1, and the window units WL and WP may be formed in a continuous process. In another exemplary embodiment, the input sensing units ISL and ISL-1, and the window units WL and WP may be combined with each other through an adhesive member. The adhesive member may include a common adhesive or an adhesive. The adhesive member shown in FIGS. 2A and 2C may be an optical transparent adhesive member OCA as an example.

In an exemplary embodiment, the display panel DP may include a base layer, a circuit element, a display element, and an encapsulation layer.

The circuit element may be disposed on the base layer and may include a signal line, a pixel driving circuit, and the like.

In an exemplary embodiment, the display element may include a pixel definition film and a light emitting diode. The display element may be disposed on the circuit element and may be electrically connected to the circuit element. The light emitting diode may be an organic light emitting diode or an inorganic light emitting diode. The display element may be a pixel.

The encapsulation layer may be disposed to cover and seal the display element. The encapsulation layer may include at least one organic film and at least one inorganic film. The encapsulation layer may be a base layer of the input sensing units ISL and ISL-1.

In an exemplary embodiment, the input sensing units ISL and ISL-1 may sense a touch or an input by an external medium such as a hand, stylus, or a pen to the display surface DD-IS of the display device DD.

In FIGS. 2A to 2C, a structure formed through a continuous process with another structure among the input sensing units ISL and ISL-1 and the window units WL and WP is described as a "layer". A layer combined with another structure of the touch sensor and the window unit is described as a "panel".

The input sensing units ISL and ISL-1 and the window units WL and WP is referred to as an input sensing panel and a window panel WP when there is the base layer therein. The input sensing units ISL and ISL-1 and the window units WL and WP are referred to an input sensing layer ISL and a window layer WL when there is no base layer.

As shown in FIG. 2A, the display device DD may include the display panel DP, the input sensing layer ISL, the anti-reflection panel RPP, and the window panel WP.

In an exemplary embodiment, the input sensing layer ISL may be disposed directly on the display panel DP.

A display module DM may include the display panel DP and the input sensing layer ISL disposed on the display panel DP. The optical transparent adhesive member OCA may be disposed between the display module DM and the anti-reflection panel RPP, and between the anti-reflection panel RPP and the window panel WP.

The input sensing layer ISL may be disposed in the display panel DP or on the display panel DP.

The display panel DP may be a light emitting display panel, but exemplary embodiments are not limited thereto. For example, the display panel DP may be an organic light emitting display panel, a quantum dot light emitting display panel, or other known type of display panel.

The anti-reflection panel RPP reduces a reflectance of external light incident from an upper side of the window panel WP. In an exemplary embodiment, the anti-reflection panel RPP may include a phase retarder and a polarizer. The phase retarder may be a film type or a liquid crystal coating type, and may include a $\lambda/2$ phase retarder and/or a $\lambda/4$ phase retarder. The polarizer may also be a film type or a liquid crystal coating type.

In an exemplary embodiment, the anti-reflection panel RPP may include color filters. The color filters have a predetermined arrangement. The arrangement of the color filters may be determined in consideration of emission colors of pixels included in the display panel DP. The anti-reflection panel RPP may further include a black matrix adjacent to the color filters.

In an exemplary embodiment, the window panel WP may include a base film WP-BS and a light blocking pattern WP-BZ. The base film WP-BS may include a glass substrate, a synthetic resin film, and/or the like. The base film WP-BS is not limited to a single layer. For example, the base film WP-BS may include two or more films combined to each other by an adhesive member.

The light blocking pattern WP-BZ partially overlaps the base film WP-BS. The light blocking pattern WP-BZ may be disposed on a back surface of the base film WP-BS to define a bezel area of the display device DD, i.e., the non-display area DD-NDA (refer to FIG. 1).

The window panel WP may further include a functional coating layer disposed on an upper surface of the base film WP-BS. The functional coating layer may include a finger prevention layer, an anti-reflection layer, a hard coating layer, and the like.

As shown in FIG. 2B, the display device DD may include the display panel DP, the input sensing layer ISL, the anti-reflection layer RPL, and the window layer WL. An adhesive member may be omitted from the display device DD, and the input sensing layer ISL, the anti-reflection layer RPL, and the window layer WL may be formed in a continuous process on the base surface provided to the display panel DP. The stacked order of the input sensing layer ISL and the anti-reflection layer RPL may be changed.

As shown in FIG. 2C, the display device DD may not include a separate anti-reflection unit. In an exemplary embodiment, the display device DD may include the display panel DP, the input sensing layer ISL-1, and the window panel WP. Here, the input sensing layer ISL-1 may further have an anti-reflection function.

In FIGS. 2A to 2C, the input sensing unit is shown as entirely overlapping the display panel. However, exemplary embodiments are not limited thereto. For example, the input sensing unit may overlap only a portion of the display area DD-DA, or may overlap only the non-display area DD-NDA. The input sensing unit may be a touch sensing panel that senses a touch of a user, or a fingerprint sensing panel that senses fingerprint information of a finger of the user. The pitch of the sensing electrodes and widths of the sensing electrodes described below may be changed according to the particular design or use of the input sensing unit.

Figure 3:
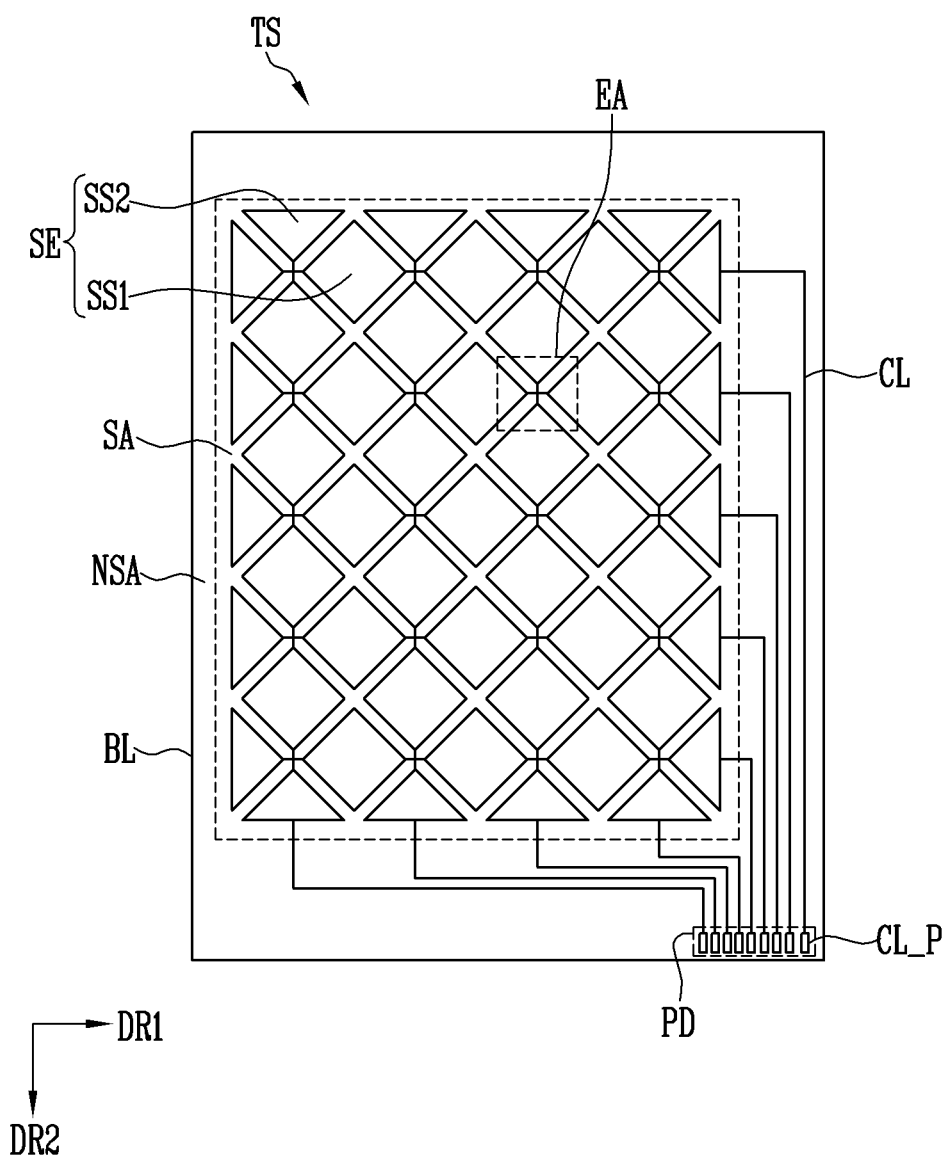
FIG. 3 is a plan view of a touch sensor of the display device of FIG. 1.

FIG. 3 is a plan view of a touch sensor of the display device of FIG. 1.

Referring to FIG. 3, the touch sensor TS may include a base layer BL, a sensing electrode layer SE, and a signal line CL. The touch sensor TS may further include a pad portion PD connected to the signal line CL.

The base layer BL may be formed of a transparent insulating material, e.g., glass, quartz, ceramic, plastic, or the like. The base layer BL may be formed as a flexible substrate when the base layer BL is formed of plastic. For example, the base layer BL may be formed of one of a polyethersulphone (PES), polyacrylate (PAR), polyetherimide (PEI), polyethyelene naphthalate (PEN), polyethylene terephthalate (PET), polyphenylene sulfide (PPS), polyallylate, polyimide, polycarbonate (PC), cellulose triacetate (SAC), and cellulose acetate propionate (CAP), but exemplary embodiments are not limited thereto.

In an exemplary embodiment, the base layer BL may be an inorganic material. For example, the base layer BL may correspond to the uppermost layer of the encapsulation layer of the display panel DP of FIGS. 2A to 2C. In this case, the base layer BL may include a silicon nitride layer, a silicon oxynitride layer, a silicon oxide layer, a titanium oxide layer, an aluminum oxide layer, or the like.

The base layer BL may include a sensing area SA that recognizes or detects the touch of the user and a non-sensing area NSA that does not recognize or detect the touch of the user. In FIG. 3, the sensing area SA and the non-sensing area NSA are shown as a quadrangle, but exemplary embodiments are not limited thereto.

The sensing area SA may overlap the display area of the display panel which may be disposed on one surface of the base layer BL. For example, the sensing area SA may have the same shape as a shape of the display area. The non-sensing area NSA may overlap the non-display area of the display panel.

The sensing area SA may be provided with a plurality of sensing electrode layers SE and the non-sensing area NSA may be provided with the pad portion PD and the signal lines CL that connect the sensing electrode layers SE to the pad portion PD. The pad portion PD may include a plurality of pads CL_P. Each of the pads CL_P may be electrically connected to the sensing electrode layer SE through the signal line CL.

The sensing electrode layer SE may include first sensing electrodes SS1 arranged in the first direction DR1. The first sensing electrodes SS1 arranged along the first direction DR1 may be electrically connected to each other. For example, the first sensing electrodes SS1 may be a plurality of first sensing electrode lines extending in the first direction DR1.

In addition, the sensing electrode layer SE may include second sensing electrodes SS2 arranged in the second direction DR2 intersecting the first direction DR1. The second sensing electrodes SS2 may be electrically connected to each other along the second direction DR2. For example, the second sensing electrodes SS2 may be a plurality of second sensing electrode lines extending in the second direction DR2.

In an exemplary embodiment, the first sensing electrodes SS1 arranged in the first direction DR1 may be integrally formed, or adjacent first sensing electrodes SS1 may be electrically connected to each other through a connector such as a connection pattern. In an exemplary embodiment, the second sensing electrodes SS2 arranged in the second direction DR2 may be integrally formed, or adjacent second sensing electrodes SS2 may be electrically connected to each other through another connector such as a connection pattern.

The first sensing electrode lines (for example, sensing electrode row) including the first sensing electrodes SS1 and the second sensing electrode lines (for example, sensing electrode column) including the second sensing electrodes SS2 may be connected to the pads CL_P through the signal lines CL, respectively. One of the sensing electrode row and the sensing electrode column may receive a driving signal for touch sensing through the signal line CL, and the other may transfer a touch sensing signal through the signal line CL.

The pad portion PD may be connected to an external driving circuit such as a position detection circuit. The sensing electrode layer SE and the external driving circuit may be electrically connected to each other.

Figure 4A:
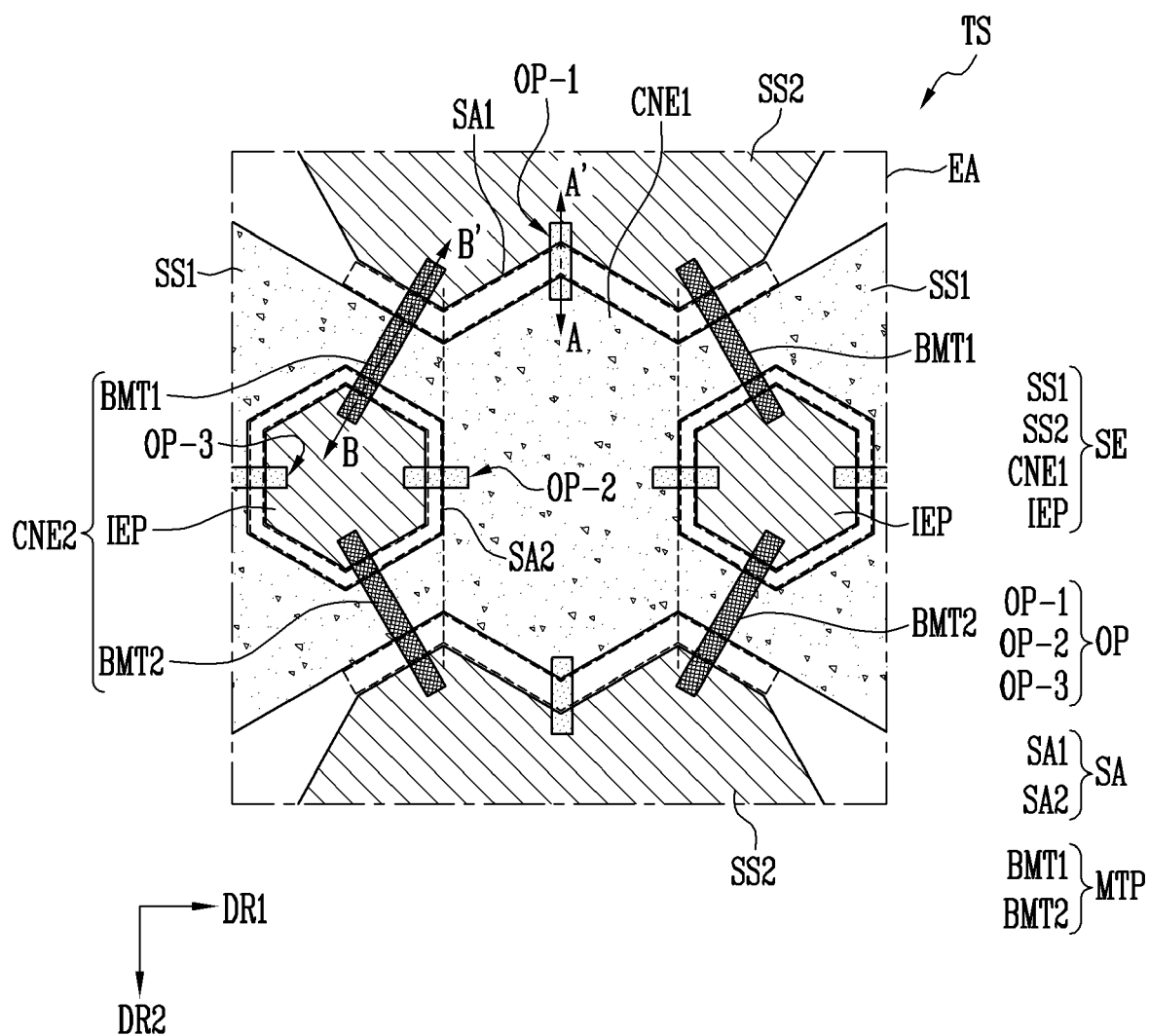
FIG. 4A is an enlarged view of an enlarged area EA portion in FIG. 3 illustrating an exemplary embodiment of the touch sensor of FIG. 3.
Figure 4B:
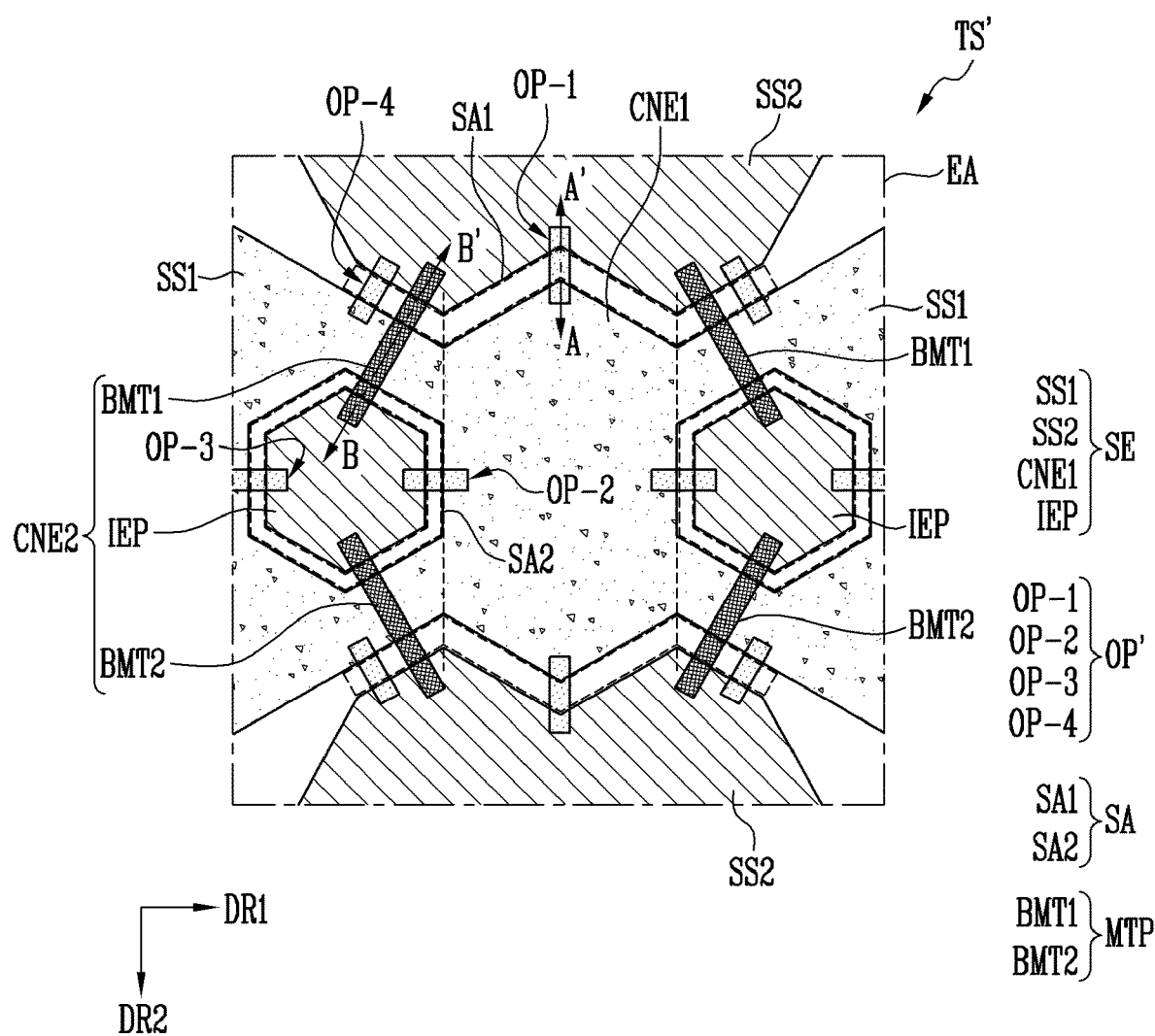
FIG. 4B is an enlarged view of the EA portion in FIG. 3 illustrating another exemplary embodiment of the touch sensor of FIG. 3.
Figure 5:
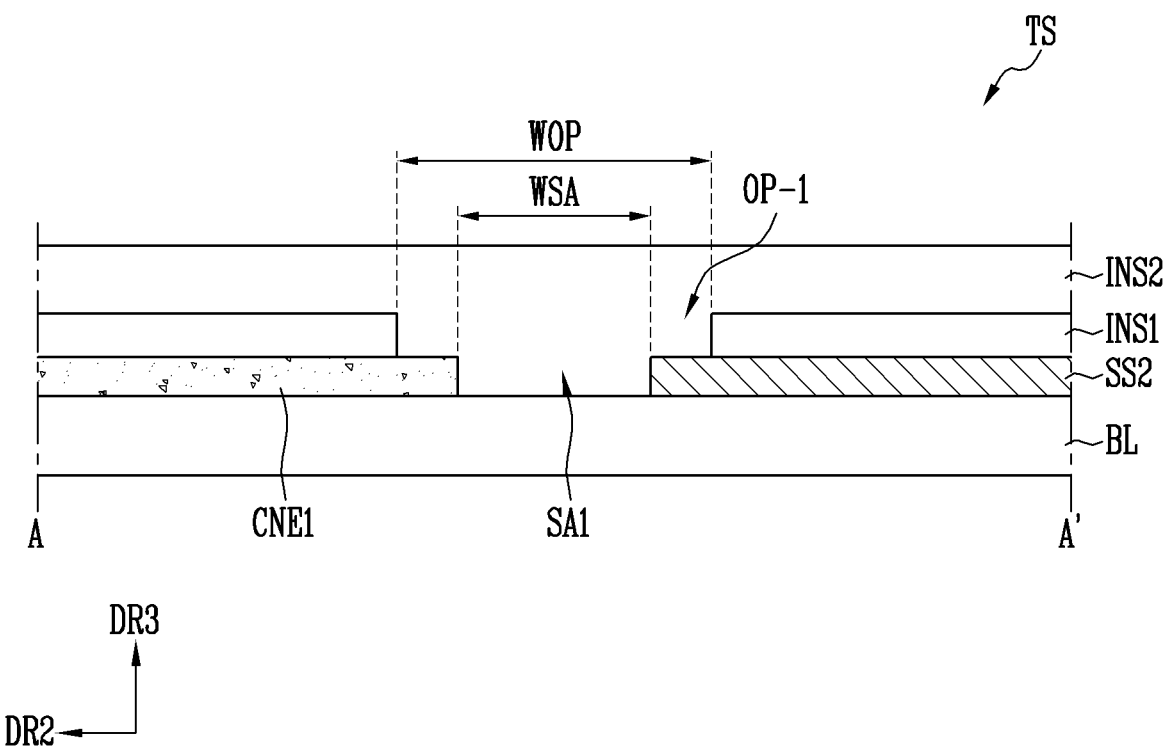
FIG. 5 is a cross-sectional view taken along lines A-A' of FIG. 4A.
Figure 6:
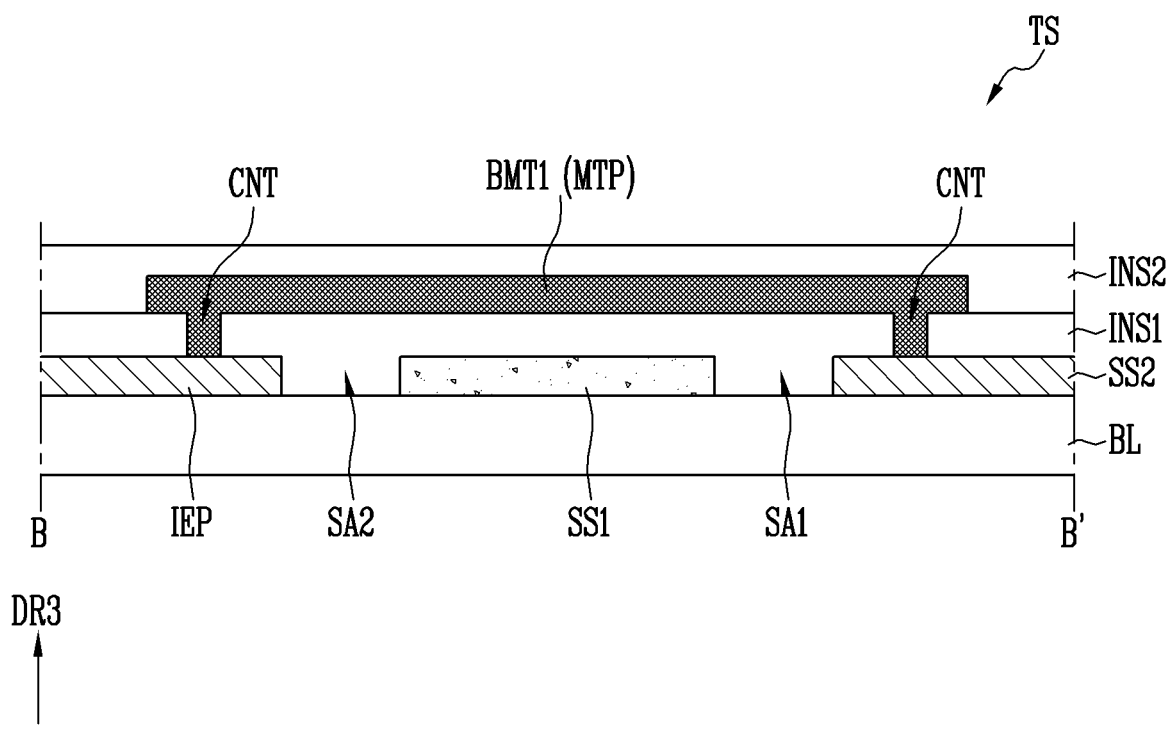
FIG. 6 is a cross-sectional view taken along lines B-B' of FIG. 4A.
Figure 7:
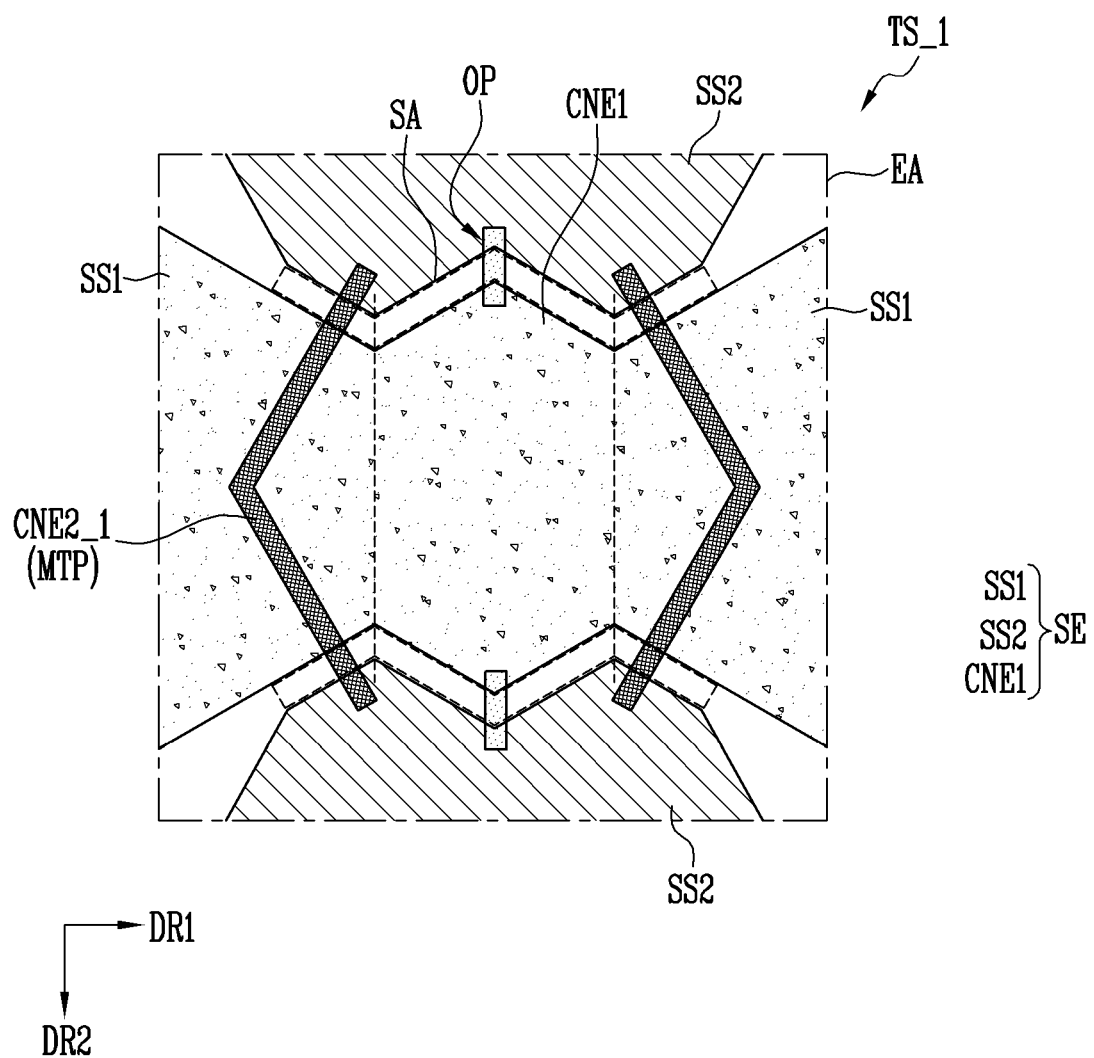
FIG. 7 is an enlarged view of the EA portion in FIG. 3 illustrating another exemplary embodiment of the touch sensor of FIG. 3.

FIG. 4A is an enlarged view of an enlarged area (EA) portion in FIG. 3 illustrating an exemplary embodiment of the touch sensor of FIG. 3. FIG. 4B is an enlarged view of the EA portion in FIG. 3 illustrating another exemplary embodiment of the touch sensor of FIG. 3. FIG. 5 is a cross-sectional view taken along lines A-A' of FIG. 4A. FIG. 6 is a cross-sectional view taken along lines a B-B' of FIG. 4A. FIG. 7 is an enlarged view of the EA portion in FIG. 3 illustrating another exemplary embodiment of the touch sensor of FIG. 3.

Referring to FIGS. 3 to 7, the touch sensor TS may include the base layer BL, the sensing electrode layer SE, a first insulating layer INS1, a conductor in the form of a conductive pattern MTP, and a second insulating layer INS2.

As shown in FIGS. 3 to 6, the sensing electrode layer SE may be disposed on the base layer BL. The sensing electrode layer SE may include the first sensing electrodes SS1, the second sensing electrodes SS2, a first connector in the form of first connection portion CNE1, and an electrode pattern IEP. The sensing electrode layer SE may be disposed in the sensing area SA.

In an exemplary embodiment, the first sensing electrodes SS1 adjacent to each other along the first direction DR1 may be connected to each other through the first connection portion CNE1. For convenience of description, the first sensing electrode SS1 and the first connection portion CNE1 are divided, but exemplary embodiments are not limited thereto. For example, the first connection portion CNE1 may be a portion of the first sensing electrodes SS1, and the first connection portion CNE1 and the first sensing electrode SS1 may be integrally formed.

The second sensing electrode SS2 may be spaced apart from the first sensing electrode SS1 and the first connection portion CNE1. The second sensing electrodes SS2 adjacent along the second direction DR2 may be connected to each other through a second connector in the form of second connection portion CNE2.

The second connection portion CNE2 may include the electrode pattern IEP and the conductive pattern MTP. Referring to FIG. 6, the electrode pattern IEP and the conductive pattern MTP may be disposed on different layers, and may be connected through a contact hole CNT passing through the first insulating layer INS1. First, the electrode pattern IEP will be described in detail, and the conductive pattern MTP will be described later.

Referring to FIGS. 4A and 4B, the electrode pattern IEP may be surrounded by the first sensing electrode SS1 and may be spaced apart from the first sensing electrodes SS1 and the second sensing electrodes SS2. The electrode pattern IEP may be positioned between adjacent second sensing electrodes SS2. For example, the electrode pattern IEP may include two adjacent electrode patterns IEP that are surrounded by adjacent first sensing electrodes SS1, respectively. The two adjacent electrode patterns IEP may be spaced apart from each other in the first direction DR1. The electrode pattern IEP may be disposed on the same layer as the first sensing electrodes SS1 and the second sensing electrodes SS2.

When the electrode pattern IEP is formed between adjacent second sensing electrodes SS2, since the length of the conductive pattern MTP for connecting the second sensing electrodes SS2 may be short (for example, compared with the conductive pattern MTP of FIG. 7), the resistance due to the conductive pattern MTP may be reduced. In addition, even though the conductive pattern MTP includes an opaque material, since the length of the conductive pattern MTP is short, the conductive pattern MTP may not be recognized or observed by the user.

The second connection portion CNE2 is not limited to the above. For example, as shown in FIG. 7, a second connection portion CNE2_1 of a touch sensor TS_1 may be formed by only the conductive pattern MTP. In this case, the electrode pattern IEP may be omitted, and the conductive pattern MTP may directly connect the second sensing electrodes SS2 adjacent to each other.

As shown in FIGS. 3 to 6, in an exemplary embodiment, a plurality of second connection portions CNE2 may connect two adjacent second sensing electrodes SS2 to each other. In FIG. 4A, two second connection portions CNE2 connect the two sensing electrodes SS2 adjacent to each other. However, exemplary embodiments are not limited thereto, and four or more second connection portions CNE2 may be formed. In addition, in FIG. 4A, the second connection portion CNE2 does not overlap the first connection portion CNE1, but exemplary embodiments are not limited thereto. For example, a portion of the second connection portion CNE2 may overlap a portion of the first connection portion CNE1.

The sensing electrode layer SE may be formed by patterning a first conductive layer coated on the base layer BL using a mask or the like.

A conductive material included in the first sensing electrodes SS1, the second sensing electrodes SS2, the first connection portion CNE1, and the electrode pattern IEP may be a transparent conductive material. In an exemplary embodiment, the first sensing electrodes SS1, the second sensing electrodes SS2, the first connection portion CNE1, and the electrode pattern IEP may include transparent conductive oxide such as indium tin oxide (ITO), indium zinc oxide (IZO), zinc oxide (ZnO), or indium tin zinc oxide (ITZO). In addition, the transparent conductive material may include a conductive polymer such as PEDOT, a metal nanowire, graphene, or the like.

The first insulating layer INS1 may be disposed on the sensing electrode layer SE. The first insulating layer INS1 may include at least one of an organic insulating layer including an organic material and an inorganic insulating layer including an inorganic material. For example, the first insulating layer INS1 may include at least one of silicon oxide, silicon nitride, and silicon oxynitride. The first insulating layer INS1 may have a single layer or a multilayer structure. The first insulating layer INS1 may be disposed between the sensing electrode layer SE and the conductive pattern MTP to prevent a short circuit between the first sensing electrode SS1 and the second sensing electrode SS2 due to the conductive pattern MTP.

The first insulating layer INS1 may include an opening OP partially exposing the sensing electrode layer SE. The opening OP may be formed in various areas of the first insulating layer INS1. The first insulating layer INS1 may include a plurality of openings OP. The opening OP may overlap at least a portion of the sensing electrode layer SE, and may be spaced apart from the conductive pattern MTP without overlapping. In an exemplary embodiment, the opening OP may include at least one of a first opening OP-1, a second opening OP-2, and a third opening OP-3.

The first opening OP-1 may be formed to overlap a first separation area SA1 between the first connection portion CNE1 and the second sensing electrode SS2. For example, the first opening OP-1 may expose a portion of the base layer BL in the first separation area SA1.

In an exemplary embodiment, the first separation area SA1 may be an area for separating the first sensing electrode SS1 and the second sensing electrode SS2 from each other to form a capacitance between the first sensing electrode SS1 and the second sensing electrode SS2. For example, the first connection portion CNE1 and the first sensing electrode SS1 may be separated from the second sensing electrode SS2 by the first separation area SA1.

Specifically, as shown in FIG. 5, a width WOP of the first opening OP-1 may be wider than a width WSA of the first separation area SA1. For example, the first opening OP-1 may extend in the second direction DR2. The first opening OP-1 may be disposed between the first bridge electrodes BMT1 adjacent to each other in the first direction DR1 when viewed in plane. In an exemplary embodiment, the first opening OP-1 may expose a portion of the first connection portion CNE1 adjacent to the first separation area SA1 and a portion of the second sensing electrode SS2 adjacent to the first separation area SA1. However, the first opening OP-1 is not limited to the above. In another exemplary embodiment, the first opening OP-1 may expose only one of the portion of the first connection portion CNE1 and the portion of the second sensing electrode SS2, or may not expose the first connection portion CNE1 and the second sensing electrode SS2.

The second opening OP-2 may be formed to overlap a second separation area SA2 between the first connection portion CNE1 and the electrode pattern IEP. For example, the second opening OP-2 may extend in the first direction DR1. The second opening OP-2 may be disposed between the first bridge electrode BMT1 and the second bridge electrode BMT2 adjacent to each other in the second direction DR2 when viewed in plane. For example, the second opening OP-2 may expose a portion of the base layer BL in the second separation area SA2. Here, the second separation area SA2 may be an area surrounding the electrode pattern IEP. The electrode pattern IEP and the first connection portion CNE1 may be separated from each other by the second separation area SA2.

In an exemplary embodiment, the second opening OP-2 may expose a portion of the first connection portion CNE1 adjacent to the second separation area SA2 and a portion of the electrode pattern IEP adjacent to the second separation area SA2. However, the second opening OP-2 is not limited to the above. In another exemplary embodiment, the second opening OP-2 may expose only one of the portion of the first connection portion CNE1 and the portion of the electrode pattern IEP, or may not expose the first connection portion CNE1 and the electrode pattern IEP.

The third opening OP-3 may be formed to overlap the second separation area SA2 between the first sensing electrode SS1 and the electrode pattern IEP. For example, the third opening OP-3 may extend in the first direction DR1. As described above, the second separation area SA2 may be an area surrounding the electrode pattern IEP, and in the second separation area SA2, the third opening OP-3 may expose a portion of the base layer BL. At this time, the second opening OP-2 and the third opening OP-3 may not overlap each other. The electrode pattern IEP and the first sensing electrode SS1 may be separated from each other by the second separation area SA2.

In an exemplary embodiment, the third opening OP-3 may expose a portion of the first sensing electrode SS1 adjacent to the second separation area SA2 and a portion of the electrode pattern IEP adjacent to the second separation area SA2. However, the third opening OP-3 is not limited to the above. In another exemplary embodiment, the third opening OP-3 may expose only one of the portion of the first sensing electrode SS1 and the portion of the electrode pattern IEP, or may not expose the first sensing electrode SS1 and the electrode pattern IEP.

The position of the opening OP is not limited to the above, and the opening OP may be formed at more various positions. For example, as shown in FIG. 4B, an opening OP' of a touch sensor TS' may further include a fourth opening OP-4. The fourth opening OP-4 may be formed to overlap the first separation area SA1 between the first sensing electrode SS1 and the second sensing electrode SS2. For example, the fourth opening OP-4 may extend in a direction different from the first and second directions DR1 and DR2. In the first separation area SA1, the fourth opening OP-4 may expose a portion of the base layer BL. The first sensing electrode SS1 and the second sensing electrode SS2 may be separated from each other by the first separation area SA1.

In an exemplary embodiment, the fourth opening OP-4 may expose a portion of the first sensing electrode SS1 adjacent to the first separation area SA1 and a portion of the second sensing electrode SS2 adjacent to the first separation area SA1. However, the fourth opening OP-4 is not limited to the above. In another exemplary embodiment, the fourth opening OP-4 may expose only one of the portion of the first sensing electrode SS1 and the portion of the second sensing electrode SS2, or may not expose the first sensing electrode SS1 and the second sensing electrode SS2.

Referring to FIG. 6, a contact hole CNT for connection between the second sensing electrode SS2 and the conductive pattern MTP and connection between the electrode pattern IEP and the conductive pattern MTP may be formed in the first insulating layer INS1. A portion of each of the second sensing electrode SS2 and the electrode pattern IEP may be exposed by the contact hole CNT. The contact hole CNT and the opening OP may be formed in different portions. In an exemplary embodiment, after the first insulating layer INS1 is deposited, a portion of the first insulating layer INS1 corresponding to the contact hole CNT may be etched, and thus a portion of the second sensing electrode SS2 may be exposed.

The conductive pattern MTP may be disposed on the first insulating layer INS1. For example, the conductive pattern MTP may be disposed on a layer different from the sensing electrode layer SE. Specifically, the conductive pattern MTP may be disposed on a layer different from the first connection portion CNE1, the first sensing electrode SS1, the second sensing electrode SS2, and the electrode pattern IEP. In an exemplary embodiment, the conductive pattern MTP may be disposed on the first insulating layer INS1 to overlap the first sensing electrode SS1, the second sensing electrode SS2, and the electrode pattern IEP.

The conductive pattern MTP may include a first bridge electrode BMT1 and a second bridge electrode BMT2. The first bridge electrode BMT1 may connect one of the adjacent second sensing electrodes SS2 and the electrode pattern IEP to each other, and the second bridge electrode BMT2 may connect the other of the adjacent second sensing electrodes SS2 and the electrode pattern IEP to each other. For example, as shown in FIG. 6, the first bridge electrode BMT1 of the conductive pattern MTP may contact the electrode pattern IEP through the contact hole CNT passing through the first insulating layer INS1 and may contact the second sensing electrode SS2 through another contact hole CNT passing through the first insulating layer INS1.

In an exemplary embodiment, the conductive pattern MTP may include an opaque metal. The conductive pattern MTP may be a single layer or multilayer structure including molybdenum (Mo). For example, the conductive pattern MTP may be a three-layer structure of molybdenum (Mo)/ aluminum (Al)/molybdenum (Mo). However, the material of the conductive pattern MTP is not limited to the above.

The conductive pattern MTP may be formed by patterning a second conductive layer deposited on the first insulating layer INS1 using a mask or the like. The contact hole CNT may be filled with a material included in the conductive pattern MTP.

The second insulating layer INS2 may be disposed on the first insulating layer INS1 to cover the conductive pattern MTP. The second insulating layer INS2 may prevent the conductive pattern MTP from being exposed to the outside. Thus corrosion and contamination of the conductive pattern MTP may be minimized or prevented. The second insulating layer INS2 may include at least one of an organic insulating layer and an inorganic insulating layer.

In an exemplary embodiment, the second insulating layer INS2 may include the same material as the first insulating layer INS1. Even though the first insulating layer INS1 and the second insulating layer INS2 include the same material, since the first insulating layer INS1 and the second insulating layer INS2 are formed in different manufacturing processes, an interface may be formed between the first insulating layer INS1 and the second insulating layer INS2. However, the material of the second insulating layer INS2 is not limited to the above. In another exemplary embodiment, the second insulating layer INS2 may include an insulating material different from that of the first insulating layer INS1.

The second insulating layer INS2 may cover an area exposed by the opening OP of the first insulating layer INS1. For example, as shown in FIG. 5, the second insulating layer INS2 may cover a portion where the base layer BL is exposed by the first opening OP-1. Accordingly, the second insulating layer INS2 may contact the base layer BL in the first separation area SA1 between the first connection portion CNE1 and the second sensing electrode SS2.

In addition, the second insulating layer INS2 may cover a portion where the sensing electrode layer SE is exposed by the first opening OP-1. For example, the second insulating layer INS2 may cover a portion of the first connection portion CNE1 and a portion of the second sensing electrode SS2 exposed by the first opening OP-1, and may contact the portion of the first connection portion CNE1 and the portion of the second sensing electrode SS2.

Further, referring to FIG. 2A, the window panel WP (or the window unit) may be disposed on the touch sensor TS (or the input sensing layer ISL). The conductive pattern MTP may be disposed between the sensing electrode layer SE and the window panel WP. For example, the conductive pattern MTP may be disposed closer to the window panel WP than the sensing electrode layer SE.

In a manufacturing process of the touch sensor TS, static electricity may be generated by an external factor (for example, a photolithography process), and the static electricity may flow into the sensing area SA of the touch sensor TS from the outside.

For example, when the static electricity flows into the touch sensor TS from the outside after the sensing electrode layer SE and the first insulating layer INS1 are formed and before the conductive pattern MTP is formed, the static electricity may be accumulated in a capacitor that is formed by the sensing electrode layers SE adjacent to each other (for example, the first connection portion CNE1 and the second sensing electrode SS2 adjacent to each other) and the first insulating layer INS1 disposed therebetween. When the static electricity is accumulated, the voltage in the capacitor can become high, and the first insulating layer INS1 may be deformed and damaged by heat caused by the high voltage. When the first insulating layer INS1 is damaged, various defects such as a defect in which the second sensing electrode SS2 is shorted may occur in a post manufacturing process.

Accordingly, the touch sensor TS according to some exemplary embodiments includes the opening OP for minimizing or preventing the accumulation of static electricity to a high voltage level. Thus, a short circuit defect or the like of the touch sensor TS in the manufacturing process due to the inflow of the static electricity may be minimized or prevented.

For example, as shown in FIG. 5, the first separation area SA1 between the first connection portion CNE1 and the second sensing electrode SS2, the portion of the first connection portion CNE1 adjacent to the first separation area SA1, and the portion of the second sensing electrode SS2 adjacent to the first separation area SA1 are exposed to an air layer by the first opening OP-1. Further, since the air layer having a dielectric constant lower than that of the first insulating layer INS1 is positioned between the first connection portion CNE1 and the second sensing electrode SS2 during the manufacturing process, the capacitance of the capacitor formed between the first connection portion CNE1 and the second sensing electrode SS2 may be minimized or reduced. Thus, the first connection portion CNE1 and the second sensing electrode SS2 may have the substantially same potential. Therefore, when the static electricity flows from the outside, the static electricity may not be accumulated in the capacitor between the first connection portion CNE1 and the second sensing electrode SS2, and the introduced static electricity may be easily discharged through another path. As a result, the touch sensor TS may have robust characteristic to minimize accumulation of static electricity during the manufacturing process, thereby protecting the touch senor TS from static electricity during the manufacturing process.

Hereinafter, another exemplary embodiment of the touch sensor will be described. In the following exemplary embodiment, description of the same components as the illustrated exemplary embodiment previously described will be referred to by the same reference numerals, will be omitted or simplified to avoid redundancy, and differences will be mainly described.

Figure 8:
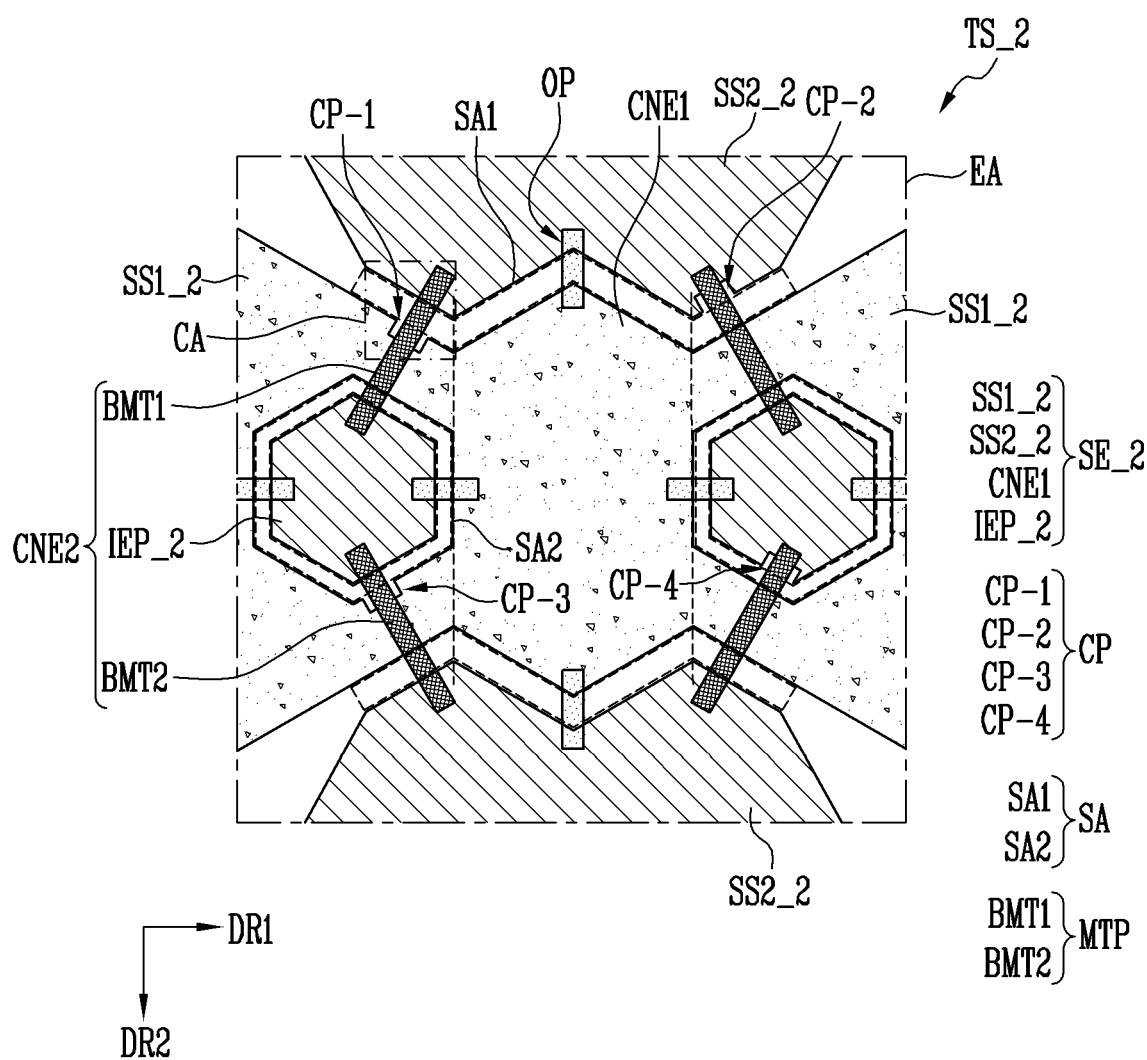
FIG. 8 is an enlarged view of the EA portion in FIG. 3 illustrating another exemplary embodiment of the touch sensor of FIG. 3.
Figure 9:
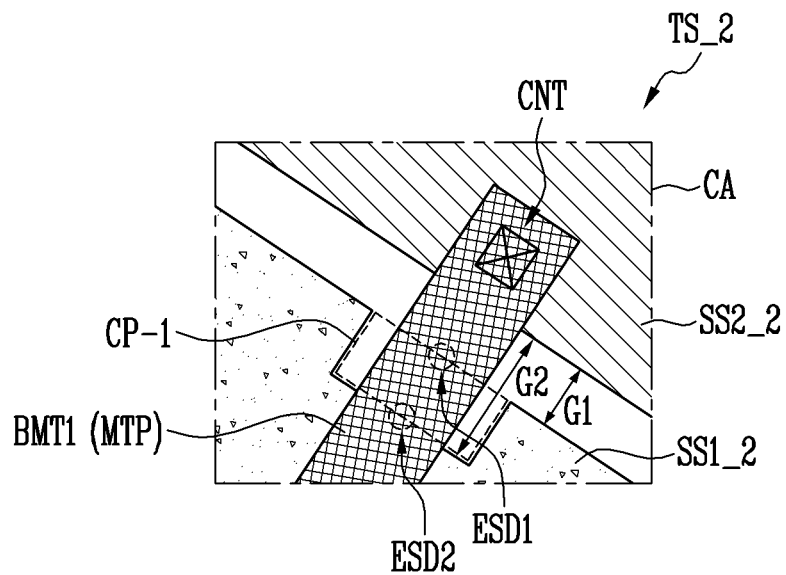
FIG. 9 is an enlarged view of a CA portion in FIG. 8.
Figure 10A:
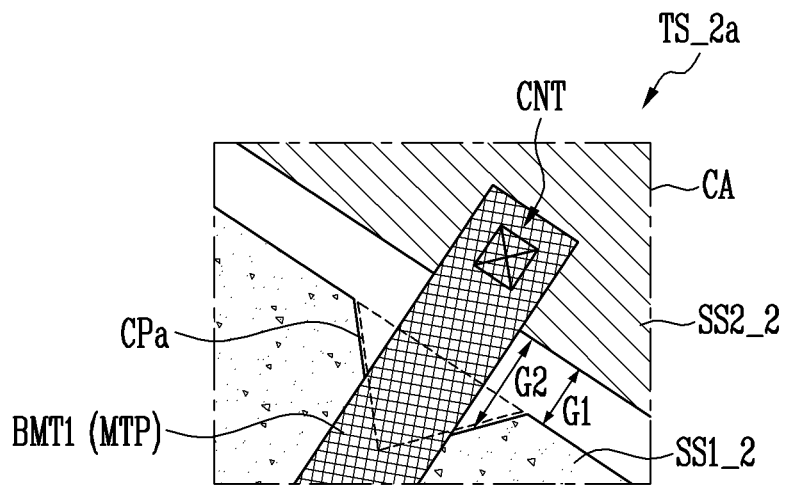
FIG. 10A is an enlarged view of the CA portion in FIG. 8 illustrating another exemplary embodiment of the touch sensor of FIG. 8.
Figure 10B:
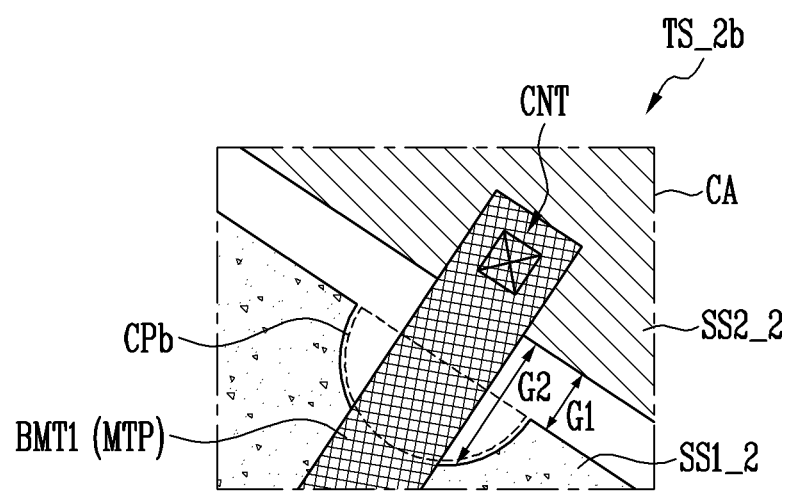
FIG. 10B is an enlarged view of the CA portion in FIG. 8 illustrating another exemplary embodiment of the touch sensor of FIG. 8.

FIG. 8 is an enlarged view of the EA portion in FIG. 3 illustrating another exemplary embodiment of the touch sensor of FIG. 3. FIG. 9 is an enlarged view of a CA portion in FIG. 8. FIG. 10A is an enlarged view the CA portion in FIG. 8 illustrating another exemplary embodiment of the touch sensor of FIG. 8. FIG. 10B is an enlarged view of the CA portion in FIG. 8 illustrating another exemplary embodiment of the touch sensor of FIG. 8.

The exemplary embodiment of FIGS. 8 to 10B is different in that the touch sensor TS_2 further includes a concave portion CP compared with the above-described exemplary embodiment of FIGS. 3 to 6, and other configurations are substantially the same.

Referring to FIGS. 4A and 8 to 10B, the touch sensor TS_2 may include a sensing electrode layer SE_2 and a conductive pattern MTP disposed on the sensing electrode layer SE_2. The sensing electrode layer SE_2 may include a first sensing electrode SS1_2, a second sensing electrode SS2_2, and a first connection portion CNE1 connecting the first sensing electrodes SS1_2 adjacent to each other. The sensing electrode layer SE_2 may include an electrode pattern IEP_2 that is surrounded by the first sensing electrode SS1_2 and spaced apart from the first sensing electrode SS1_2 and the second sensing electrode SS2_2.

In an exemplary embodiment, the sensing electrode layer SE_2 may include at least one recess in the form of a concave portion CP. A plurality of concave portions CP may be formed in various areas of the sensing electrode layer SE_2. The concave portion CP may be formed in an area overlapping the conductive pattern MTP. Specifically, the concave portion CP may include at least one of a first concave portion CP-1, a second concave portion CP-2, a third concave portion CP-3, and a fourth concave portion CP-4.

The first concave portion CP-1 may be positioned between the first sensing electrode SS1_2 and the second sensing electrode SS2_2 adjacent to each other. The first concave portion CP-1 may be formed adjacent to an edge of the first sensing electrode SS1_2. The first concave portion CP-1 may be formed in a shape recessed from the edge of the first sensing electrode SS1_2 to the inside of the first sensing electrode SS1_2 in a plan view. For example, the first concave portion CP-1 may be formed at the edge of the first sensing electrode SS1_2 and recessed toward the electrode pattern IEP_2 surrounded by the first sensing electrode SS1_2. The first concave portion CP-1 may be an area from which at least a portion of the edge of the first sensing electrode SS1_2 is removed.

At least a portion of the first concave portion CP-1 may overlap the conductive pattern MTP. For example, the first concave portion CP-1 may overlap the first bridge electrode BMT1 of the conductive pattern MTP.

Similarly to the first concave portion CP-1, the second concave portion CP-2 may be positioned between the first sensing electrode SS1_2 and the second sensing electrode SS2_2 adjacent to each other. The second concave portion CP-2 may be formed adjacent to an edge of the second sensing electrode SS2_2. The second concave portion CP-2 may be formed in a shape recessed from the edge of the second sensing electrode SS2_2 to the inside of the second sensing electrode SS2_2 in a plan view. The second concave portion CP-2 may be an area from which at least a portion of the edge of the second sensing electrode SS2_2 is removed.

At least a portion of the second concave portion CP-2 may overlap the conductive pattern MTP. For example, the second concave portion CP-2 may overlap the first bridge electrode BMT1 of the conductive pattern MTP.

The third concave portion CP-3 may be positioned between the first sensing electrode SS1_2 and the electrode pattern IEP_2 adjacent to each other. The third concave portion CP-3 may be formed adjacent to the edge of the first sensing electrode SS1_2. The third concave portion CP-3 may be formed in a shape recessed from the edge of the first sensing electrode SS1_2 to the inside of the first sensing electrode SS1_2 in a plan view. The third concave portion CP-3 may be an area from which at least a portion of the edge of the first sensing electrode SS1_2 is removed.

At least a portion of the third concave portion CP-3 may overlap the conductive pattern MTP. For example, the third concave portion CP-3 may overlap the second bridge electrode BMT2 of the conductive pattern MTP.

The fourth concave portion CP-4 may be positioned between the first sensing electrode SS1_2 and the electrode pattern IEP_2 of the sensing electrode layer SE_2 adjacent to each other. The fourth concave portion CP-4 may be formed adjacent to an edge of the electrode pattern IEP_2. The fourth concave portion CP-4 may be formed in a shape recessed from the edge of the electrode pattern IEP_2 to the inside of the electrode pattern IEP_2 in a plan view. The fourth concave portion CP-4 may be an area from which at least a portion of the edge of the electrode pattern IEP is removed.

At least a portion of the fourth concave portion CP-4 may overlap the conductive pattern MTP. For example, the fourth concave portion CP-4 may overlap the second bridge electrode BMT2 of the conductive pattern MTP.

As described above, when the sensing electrode layer SE_2 of the touch sensor TS_2 includes the concave portion CP in an area overlapping the conductive pattern MTP, in a manufacturing process of the touch sensor TS_2, the accumulation of static electricity in a capacitor between adjacent electrodes (for example, the first sensing electrode SS1_2 and the second sensing electrode SS2_2) may be reduced. Accordingly, the touch sensor TS_2 may be protected from static electricity in the manufacturing process such that damage of the sensing electrode layer SE_2 due to the static electricity may be minimized.

Specifically, in order to prevent a defect due to static electricity in the manufacturing process, each of the first sensing electrode SS1_2 and the second sensing electrode SS2_2 may be electrically connected to an anti-static structure through the signal line CL. For example, the static electricity flowed into the first sensing electrode SS1_2 may be moved to the anti-static structure through the first connection portion CNE1 and the first sensing electrodes SS1_2 and may be discharged, and the static electricity flowed into the second sensing electrode SS2_2 may be moved to the anti-static structure through the second connection portion CNE2 and the second sensing electrode SS2_2 and may be discharged.

Referring to FIG. 9, the static electricity flowed into the second sensing electrode SS2_2 may be moved to the conductive pattern MTP through the contact hole CNT, may be moved to another second sensing electrode SS2_2 or anti-static structure along the conductive pattern MTP, and may be discharged. In a process in which the introduced static electricity moves through the conductive pattern MTP, static electricity may be accumulated to generate a voltage in an area overlapping the conductive pattern MTP. For example, static electricity may be accumulated in a capacitor formed between the first sensing electrode SS1_2 and the second sensing electrode SS2_2 in the area overlapping the conductive pattern MTP.

When the first sensing electrode SS1_2 does not include the first concave portion CP-1, the distance between the first sensing electrode SS1_2 and the second sensing electrode SS2_2 becomes narrowed to a first distance G1. Thus, the capacitor formed between the first sensing electrode SS1_2 and the second sensing electrode SS2_2 may have a large capacitance. As a result, the static electricity may accumulate voltage to a high level.

As described above, when the static electricity is accumulated to the high voltage, the first insulating layer INS1 covering the sensing electrode layer SE_2 may be deformed or damaged by heat caused by the high voltage. In particular, the static electricity may be accumulated to the high voltage at a first point ESD1 as an intersection point between the edge of the first sensing electrode SS1_2 and the conductive pattern MTP. When the first insulating layer INS1 of the first point ESD1 is damaged by the static electricity accumulated to the high voltage, a portion of the first sensing electrode SS1_2 may be exposed. Thus, a defect of a short circuit between the first sensing electrode SS1_2 and the conductive pattern MTP may occur.

Accordingly, as shown in FIG. 9, when the touch sensor TS_2 includes the first concave portion CP-1, the area where the static electricity of the first sensing electrode SS1_2 is accumulated may be changed from the first point ESD1 to a second point ESD2. In addition, the distance between the first sensing electrode SS1_2 and the second sensing electrode SS2_2 may be increased from the first distance G1 to a second distance G2. As the distance between the first sensing electrode SS1_2 and the second sensing electrode SS2_2 is increased, the capacitance of a capacitor formed between the first sensing electrode SS1_2 and the second sensing electrode SS2_2 may be decreased. Thus, the damage of the first insulating layer INS1 due to the accumulated static electricity between the first sensing electrode SS1_2 and the second sensing electrode SS2_2 may be minimized or prevented.

In FIGS. 8 and 9, the shape of the concave portion CP is a generally quadrangle shape in a plan view, but exemplary embodiments are not limited thereto. When the second distance G2 between the sensing electrode layers SE_2 (for example, the first sensing electrode SS1_2 and the second sensing electrode SS2_2) adjacent to each other in an area including the concave portion CP is greater than the first distance G1 between the sensing electrode layers SE_2 adjacent to each other in an area that does not include the concave portion CP, the shape of the concave portion CP is not limited to a particular shape. For example, as shown in FIG. 10A, a touch sensor TS_2a may include a concave portion CPa having a triangular shape in a plan view. In addition, as shown in FIG. 10B, a touch sensor TS_2b may include a concave portion CPb having a semicircular shape in a plan view.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A touch sensor for a display device, the touch sensor comprising:
a base layer;
a plurality of first sensing electrodes and a plurality of second sensing electrodes spaced apart from each other on the base layer;
a first connector electrically connecting the first sensing electrodes adjacent to each other;
a first insulating layer disposed on the first sensing electrodes and the second sensing electrodes;
a conductor disposed on the first insulating layer and connected to the second sensing electrodes through the first insulating layer; and
a second insulating layer disposed on the first insulating layer to cover the conductor, wherein:
the first insulating layer includes a first opening exposing at least one of a portion of a first separation area between the first connector and the second sensing electrodes, a portion of the first connector, and a portion of the second sensing electrodes,
the first opening is spaced apart from the conductor,
the first opening exposes a portion of the base layer in the first separation area, and
the second insulating layer contacts the base layer through the first opening.

2. The touch sensor of claim 1, wherein the first sensing electrodes are arranged along a first direction,
the second sensing electrodes are arranged along a second direction intersecting the first direction, and
the first sensing electrodes, the second sensing electrodes, and the first connector are disposed on a same layer.

3. The touch sensor of claim 2, further comprising:
an electrode electrically connecting the second sensing electrodes adjacent to each other,
wherein the electrode is disposed on the same layer as the first sensing electrodes and surrounded by the first sensing electrodes, and the electrode is spaced apart from the first sensing electrodes and the second sensing electrodes.

4. The touch sensor of claim 3, wherein the first insulating layer further includes a second opening overlapping a second separation area between the electrode and the first connector, and
the second opening exposes a portion of the electrode and a portion of the first connector.

5. The touch sensor of claim 4, wherein the first insulating layer further includes a third opening overlapping the second separation area, and
the third opening exposes another portion of the electrode and a portion of the first sensing electrodes.

6. The touch sensor of claim 3, wherein the first connector comprises a first connection portion, the conductor comprises a conductive pattern, and the electrode comprises an electrode pattern, and the conductive pattern is connected to the electrode pattern through a contact hole passing through the first insulating layer, and
the conductive pattern and the electrode pattern constitute a second connection portion electrically connecting the second sensing electrodes adjacent to each other.

7. The touch sensor of claim 6, wherein the conductive pattern comprises:
a first bridge electrode connected to one of the second sensing electrodes adjacent to each other and the electrode pattern; and
a second bridge electrode connected to another one of the second sensing electrodes adjacent to each other and the electrode pattern.

8. The touch sensor of claim 7, wherein:
at least one of the first sensing electrodes, the second sensing electrodes, and the electrode pattern includes a recess extending inwardly from an edge in a plan view, and
the recess overlaps one of the first bridge electrode and the second bridge electrode.

9. The touch sensor of claim 1, wherein the second insulating layer contacts the portion of the first connector and the portion of the second sensing electrodes exposed by the first opening.

10. The touch sensor of claim 1, wherein the first insulating layer further includes a fourth opening exposing the first separation area between the first sensing electrodes and the second sensing electrodes, a portion of the first sensing electrodes, and a portion of the second sensing electrodes.

11. The touch sensor of claim 1, wherein the conductor electrically connects the second sensing electrodes adjacent to each other through a contact hole passing through the first insulating layer.

12. The touch sensor of claim 1, wherein the first sensing electrodes, the second sensing electrodes, and the first connector include a transparent conductive material.

13. The touch sensor of claim 1, wherein the conductor comprises a conductive pattern having a single layer or multilayer structure including molybdenum (Mo).

14. A touch sensor for a display device, the touch sensor comprising:
a base layer including a sensing area;
a sensing electrode layer disposed in the sensing area of the base layer;
a first insulating layer disposed on the sensing electrode layer;
a conductor disposed on the first insulating layer and connected to a portion of the sensing electrode layer through the first insulating layer; and
a second insulating layer disposed on the first insulating layer to cover the conductor, wherein:
the sensing electrode layer includes a recess extending inwardly from an edge in a plan view, and
the recess overlaps the conductor.

15. The touch sensor of claim 14, wherein the sensing electrode layer comprises:
a plurality of first sensing electrodes arranged along a first direction;
a plurality of second sensing electrodes arranged along a second direction intersecting the first direction and spaced apart from the first sensing electrodes by a first distance; and
a first connector electrically connecting the first sensing electrodes adjacent to each other, and wherein:
the recess comprises a concave portion disposed adjacent to an edge of the first sensing electrodes and the second sensing electrodes, and
the conductor electrically connects the second sensing electrodes adjacent to each other through a contact hole passing through the first insulating layer.

16. The touch sensor of claim 15, wherein a second distance between the first sensing electrodes and the second sensing electrodes adjacent to each other in an area including the concave portion is greater than the first distance.

17. The touch sensor of claim 14, wherein:
the sensing electrode layer includes a transparent conductive material, and
the conductor comprises a conductive pattern having a single layer or multilayer structure including molybdenum (Mo).

18. The touch sensor of claim 14, wherein the recess has one of a generally polygonal and a semicircular shape in a plan view.

19. A display device comprising:
a display panel including a light emitting element and an encapsulation layer covering the light emitting element; and
a touch sensor disposed on the display panel,
wherein the touch sensor comprises:
a base layer;
a plurality of first sensing electrodes and a plurality of second sensing electrodes spaced apart from each other on the base layer;
a first connector electrically connecting the first sensing electrodes adjacent to each other;
a first insulating layer disposed on the first sensing electrodes and the second sensing electrodes;
a conductor disposed on the first insulating layer and connected to the second sensing electrodes through the first insulating layer; and
a second insulating layer disposed on the first insulating layer to cover the conductor, wherein:
the first insulating layer includes a first opening exposing a first separation area between the first connector and the second sensing electrodes, a portion of the first connector, and a portion of the second sensing electrodes,
the first opening is spaced apart from the conductor,
the first opening exposes a portion of the base layer in the first separation area, and
the second insulating layer contacts the base layer through the first opening.

* * * * *